(12) United States Patent
Hung et al.

(10) Patent No.: US 11,450,759 B2
(45) Date of Patent: Sep. 20, 2022

(54) GATE ALL AROUND I/O ENGINEERING

(71) Applicant: Applied Materials, Inc., Santa Clara, CA (US)

(72) Inventors: Steven C. H. Hung, Sunnyvale, CA (US); Benjamin Colombeau, San Jose, CA (US); Andy Lo, Saratoga, CA (US); Byeong Chan Lee, Pleasanton, CA (US); Johanes F. Swenberg, Los Gatos, CA (US); Theresa Kramer Guarini, San Jose, CA (US); Malcolm J. Bevan, Santa Clara, CA (US)

(73) Assignee: Applied Materials, Inc., Santa Clara, CA (US)

( * ) Notice: Subject to any disclaimer, the term of this patent is extended or adjusted under 35 U.S.C. 154(b) by 191 days.

(21) Appl. No.: 17/037,941

(22) Filed: Sep. 30, 2020

(65) Prior Publication Data

US 2021/0104617 A1    Apr. 8, 2021

Related U.S. Application Data

(60) Provisional application No. 62/909,329, filed on Oct. 2, 2019.

(51) Int. Cl.
| | | |
|---|---|---|
| *H01L 29/66* | (2006.01) | |
| *H01L 21/02* | (2006.01) | |
| *H01L 29/423* | (2006.01) | |
| *C30B 29/06* | (2006.01) | |
| *C30B 29/52* | (2006.01) | |

(Continued)

(52) U.S. Cl.
CPC ............ *H01L 29/6681* (2013.01); *C23C 8/02* (2013.01); *C23C 8/16* (2013.01); *C23C 8/80* (2013.01); *C23C 16/45536* (2013.01); *C23C 16/56* (2013.01); *C30B 29/06* (2013.01); *C30B 29/52* (2013.01); *H01L 21/022* (2013.01); *H01L 21/0228* (2013.01); *H01L 21/02238* (2013.01); *H01L 21/02255* (2013.01); *H01L 29/42392* (2013.01); *H01L 29/6653* (2013.01)

(58) Field of Classification Search
None
See application file for complete search history.

(56) References Cited

U.S. PATENT DOCUMENTS

| | | | |
|---|---|---|---|
| 8,753,942 B2 | 6/2014 | Kuhn et al. | |
| 9,484,267 B1* | 11/2016 | Cheng | ............... H01L 29/78684 |

(Continued)

FOREIGN PATENT DOCUMENTS

| | | |
|---|---|---|
| KR | 100630764 B1 | 10/2006 |
| WO | 2013112702 A1 | 8/2013 |

OTHER PUBLICATIONS

PCT International Search Report and Written Opinion in PCT/US2020/053672 dated Jan. 20, 2021, 10 pages.

*Primary Examiner* — Alexander G Ghyka
(74) *Attorney, Agent, or Firm* — Servilla Whitney LLC

(57) ABSTRACT

Described is a method of manufacturing a gate-all-around electronic device. The method includes forming a thermal oxide layer though an enhanced in situ steam generation process in combination with atomic layer deposition of a low-κ layer. The thin thermal oxide layer passivates the interface between the silicon layer and the dielectric layer of the GAA. A passivation process after the deposition of the low-κ layer reduces the bulk trap and enhances the breakdown performance of the GAA transistor.

19 Claims, 4 Drawing Sheets

(51) Int. Cl.
*C23C 8/02* (2006.01)
*C23C 8/16* (2006.01)
*C23C 8/80* (2006.01)
*C23C 16/56* (2006.01)
*C23C 16/455* (2006.01)

(56) References Cited

U.S. PATENT DOCUMENTS

| | | |
|---|---|---|
| 9,754,840 B2 | 9/2017 | Lin |
| 9,853,129 B2 | 12/2017 | Bauer et al. |
| 2017/0194143 A1* | 7/2017 | Balakrishnan ........ H01L 29/495 |
| 2017/0317168 A1 | 11/2017 | Cheng et al. |
| 2018/0122900 A1* | 5/2018 | Cheng ................. H01L 29/0673 |
| 2018/0182893 A1 | 6/2018 | Coquand et al. |
| 2018/0315665 A1* | 11/2018 | Mosden ............ H01L 29/78696 |
| 2018/0366375 A1* | 12/2018 | Chen ................... H01L 27/0886 |
| 2019/0085240 A1* | 3/2019 | Liu .................... H01L 21/30608 |
| 2019/0393304 A1* | 12/2019 | Guillorn ............... H01L 21/308 |
| 2021/0082686 A1* | 3/2021 | Chiang ............... H01L 21/0245 |

* cited by examiner

GATE ALL AROUND I/O ENGINEERING

CROSS-REFERENCE TO RELATED APPLICATIONS

This application claims priority to U.S. Provisional Application No. 62/909,329, filed Oct. 2, 2019, the entire disclosure of which is hereby incorporated by reference herein.

TECHNICAL FIELD

Embodiments of the present disclosure generally relate to the fabrication of integrated circuits. More particularly, embodiments pertain to material and integration in gate-all-around gate engineering.

BACKGROUND

The transistor is a key component of most integrated circuits. Since the drive current, and therefore speed, of a transistor is proportional to the gate width of the transistor, faster transistors generally require larger gate width. Thus, there is a trade-off between transistor size and speed, and "fin" field-effect transistors (finFETs) have been developed to address the conflicting goals of a transistor having maximum drive current and minimum size. FinFETs are characterized by a fin-shaped channel region that greatly increases the size of the transistor without significantly increasing the footprint of the transistor, and are now being applied in many integrated circuits. However, finFETs have their own drawbacks.

The formation of horizontal source/drain extensions becomes increasingly difficult for narrow and tall finFETs, since the fin-shaped channel region can be easily amorphized or otherwise damaged by conventional ion implantation techniques, such as beamline ion implant. Specifically, in some finFET architectures (e.g. horizontal Gate-All-Around, h-GAA), ion implantation can cause serious intermixing between the silicon channel and the adjacent silicon-germanium (SiGe) sacrificial layer. Such intermixing is highly undesirable, since the ability to selectively remove the sacrificial SiGe layer is then compromised. In addition, repair of such implant damage via thermal anneal increases the thermal budget of the finFET device.

Logic gate performance is related to the characteristics of the materials used as well as the thickness and area of the structural layers. However, as some gate characteristics are adjusted to accommodate device scaling, challenges arise. Furthermore, the space confinement between pillars on a horizontal gate-all-around (hGAA) device limits the thickness of the gate dielectric material for I/O transistors. Accordingly, there is a need for material and integration options to address this space confinement in hGAA devices.

SUMMARY

One or more embodiments of the disclosure are directed to a method of manufacturing an electronic device, the method comprising: forming alternating layers of silicon (Si) and silicon germanium (SiGe) on a substrate; patterning and etching the alternating layers of silicon and silicon germanium to expose at least one side wall of the silicon layer and at least one sidewall of the silicon germanium layer; selectively etching the silicon germanium layer to form an opening; forming a thermal oxide layer on the silicon layer through the opening; passivating the thermal oxide layer to form a passivated thermal oxide layer; depositing a low-κ layer on the passivated thermal oxide layer through the opening; and densifying the low-κ layer to form a densified low-κ layer Additional embodiments of the disclosure are directed to a processing tool for forming a semiconductor device, the processing tool comprising: a central transfer station having a plurality of processing chambers disposed around the central transfer station; a robot within the central transfer station configured to move a substrate between the plurality of processing chambers; a first processing chamber connected to the central transfer station, the first processing chamber configured to perform an in situ steam generation process to deposit a thermal oxide layer; a metrology station within the processing tool accessible to the robot, the metrology station configured to determine a thickness of the thermal oxide layer on a substrate; a second processing chamber connected to the central transfer station, the second processing chamber configured to perform an atomic layer deposition process; and a controller connected to one or more of the central transfer station, the robot, the first processing chamber, the metrology station or the second processing chamber, the controller having one or more configurations selected from a first configuration to move a substrate on the robot between the plurality of processing chambers and metrology station; a second configuration to perform an in situ steam generation process to deposit a thermal oxide layer on a substrate in the first processing chamber; a third configuration to perform an analysis to determine the thickness of the thermal oxide layer in the metrology station; or a fourth configuration to perform an atomic layer deposition process in the second processing chamber, the atomic layer deposition adjusted for the thickness of the thermal oxide layer.

Further embodiments of the disclosure are directed to a non-transitory computer readable medium including instructions, that, when executed by a controller of a processing chamber, causes the processing chamber to perform operations of: forming alternating layers of silicon and silicon germanium on a substrate; patterning and etching the alternating layers of silicon and silicon germanium to expose at least one sidewall; selectively etching the silicon germanium layers; performing an enhanced in situ steam generation process to form a thermal oxide layer on the silicon layer; passivating the thermal oxide layer; depositing a low-κ layer; and densifying and/or passivating the low-κ layer.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

DETAILED DESCRIPTION

Figure 1:
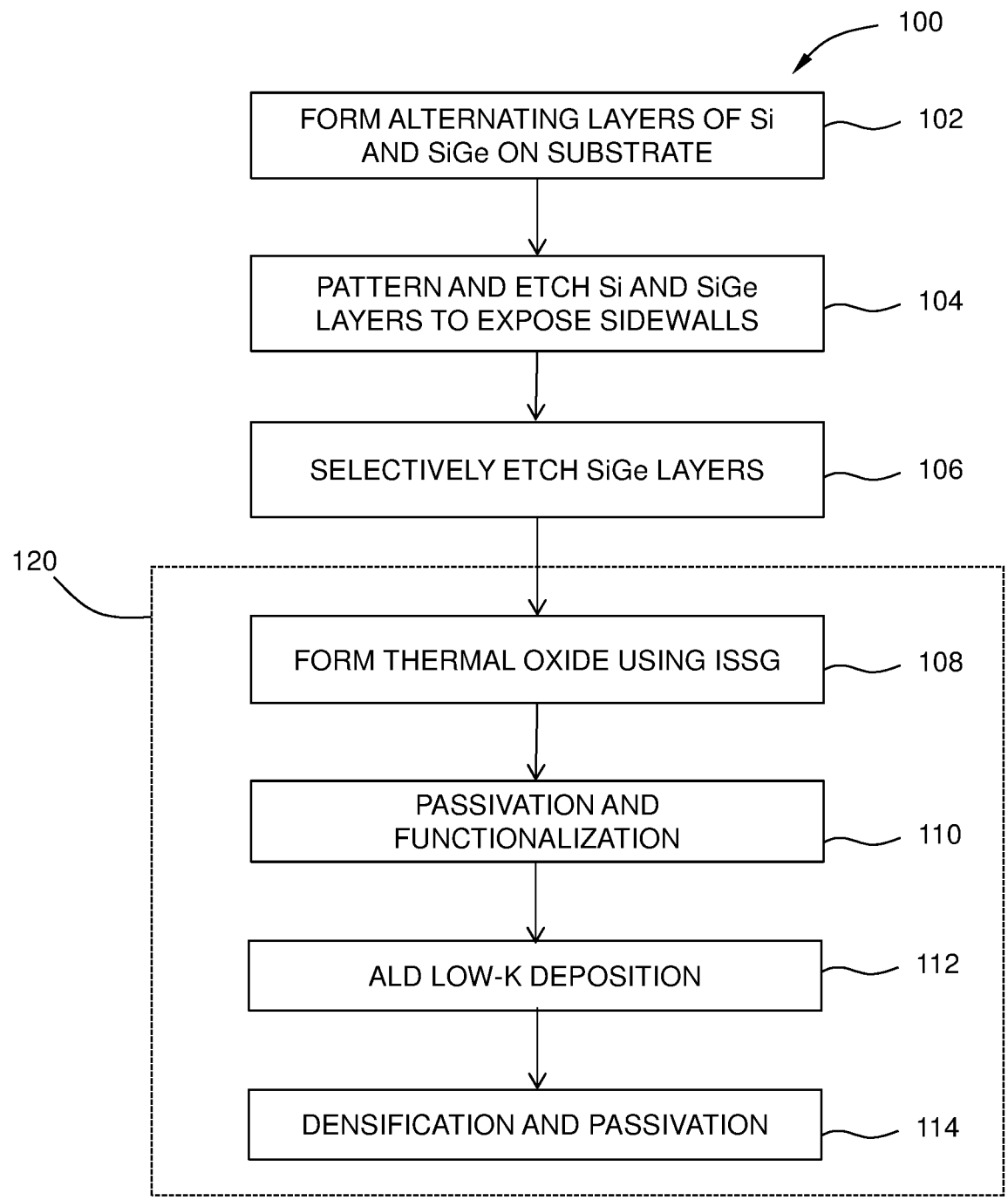
FIG. 1 is a process flow diagram of a manufacturing process for forming a gate-all-around (GAA) transistor, according to one or more embodiments of the disclosure.

Before describing several exemplary embodiments of the disclosure, it is to be understood that the disclosure is not limited to the details of construction or process steps set forth in the following description. The disclosure is capable of other embodiments and of being practiced or being carried out in various ways.

As used in this specification and the appended claims, the term "substrate" refers to a surface, or portion of a surface, upon which a process acts. It will also be understood by those skilled in the art that reference to a substrate can also refer to only a portion of the substrate, unless the context clearly indicates otherwise. Additionally, reference to depositing on a substrate can mean both a bare substrate and a substrate with one or more films or features deposited or formed thereon.

A "substrate" as used herein, refers to any substrate or material surface formed on a substrate upon which film processing is performed during a fabrication process. For example, a substrate surface on which processing can be performed include materials such as silicon, silicon oxide, strained silicon, silicon on insulator (SOI), carbon doped silicon oxides, amorphous silicon, doped silicon, germanium, gallium arsenide, glass, sapphire, and any other materials such as metals, metal nitrides, metal alloys, and other conductive materials, depending on the application. Substrates include, without limitation, semiconductor wafers. Substrates may be exposed to a pretreatment process to polish, etch, reduce, oxidize, hydroxylate, anneal and/or bake the substrate surface. In addition to film processing directly on the surface of the substrate itself, in the present disclosure, any of the film processing steps disclosed may also be performed on an under-layer formed on the substrate as disclosed in more detail below, and the term "substrate surface" is intended to include such under-layer as the context indicates. Thus for example, where a film/layer or partial film/layer has been deposited onto a substrate surface, the exposed surface of the newly deposited film/layer becomes the substrate surface.

As used in this specification and the appended claims, the terms "precursor", "reactant", "reactive gas" and the like are used interchangeably to refer to any gaseous species that can react with the substrate surface.

Transistors are circuit components or elements that are often formed on semiconductor devices. Depending upon the circuit design, in addition to capacitors, inductors, resistors, diodes, conductive lines, or other elements, transistors are formed on a semiconductor device. Generally, a transistor includes a gate formed between source and drain regions. In one or more embodiments, the source and drain regions include a doped region of a substrate and exhibit a doping profile suitable for a particular application. The gate is positioned over the channel region and includes a gate dielectric interposed between a gate electrode and the channel region in the substrate.

As used herein, the term "field effect transistor" or "FET" refers to a transistor that uses an electric field to control the electrical behavior of the device. Field effect transistors generally display very high input impedance at low temperatures. The conductivity between the drain and source terminals is controlled by an electric field in the device, which is generated by a voltage difference between the body and the gate of the device. The FET's three terminals are source (S), through which the carriers enter the channel; drain (D), through which the carriers leave the channel; and gate (G), the terminal that modulates the channel conductivity. Conventionally, current entering the channel at the source (S) is designated $I_S$ and current entering the channel at the drain (D) is designated $I_D$. Drain-to-source voltage is designated $V_{DS}$. By applying voltage to gate (G), the current entering the channel at the drain (i.e. $I_D$) can be controlled.

The metal-oxide-semiconductor field-effect transistor (MOSFET) is a type of field-effect transistor (FET). It has an insulated gate, whose voltage determines the conductivity of the device. This ability to change conductivity with the amount of applied voltage is used for amplifying or switching electronic signals. A MOSFET is based on the modulation of charge concentration by a metal-oxide-semiconductor (MOS) capacitance between a body electrode and a gate electrode located above the body and insulated from all other device regions by a gate dielectric layer. Compared to the MOS capacitor, the MOSFET includes two additional terminals (source and drain), each connected to individual highly doped regions that are separated by the body region. These regions can be either p or n type, but they are both be of the same type, and of opposite type to the body region. The source and drain (unlike the body) are highly doped as signified by a "+" sign after the type of doping.

If the MOSFET is an n-channel or nMOS FET, then the source and drain are n+ regions and the body is a p region. If the MOSFET is a p-channel or pMOS FET, then the source and drain are p+ regions and the body is an n region. The source is so named because it is the source of the charge carriers (electrons for n-channel, holes for p-channel) that flow through the channel; similarly, the drain is where the charge carriers leave the channel.

As used herein, the term "fin field-effect transistor (FinFET)" refers to a MOSFET transistor built on a substrate where the gate is placed on two, three, or four sides of the channel or wrapped around the channel, forming a double gate structure. FinFET devices have been given the generic name FinFETs because the source/drain region forms "fins" on the substrate. FinFET devices have fast switching times and high current density.

As used herein, the term "gate all-around (GAA)," is used to refer to an electronic device, e.g. a transistor, in which the gate material surrounds the channel region on all sides. The channel region of a GAA transistor may include nanowire channels, bar-shaped channels, or other suitable channel configurations known to one of skill in the art. In one or more embodiments, the channel region of a GAA device has multiple horizontal nanowires or horizontal bars vertically spaced, making the GAA transistor a stacked horizontal gate-all-around (hGAA) transistor.

In one or more embodiments, a horizontal gate-all-around (hGAA) transistor comprises a substrate having a top surface; a source region having a source and a source contact, the source region on the top surface of the substrate; a drain region having a drain and a drain contact, the drain region on the top surface of the substrate; a channel located between the source and the drain and having an axis that that is substantially orthogonal to the top surface of the substrate; a gate enclosing the channel between the source region and the drain region; a thermal oxide layer overlying and in contact with one or more of the gate, the source contact, or the drain contact, and a low-κ dielectric layer overlying the thermal oxide layer. In one or more embodiments, the low-κ dielectric layer has a thickness less than about 2 nm.

Embodiments of the present disclosure relate to gate-all-around transistors having a thin thermal oxide interface in combination with a layer of a low-κ material to achieve a high equivalent oxide thickness (EOT). In one or more embodiments, the use of a thin layer of a thermal oxide in combination with a low-κ dielectric material increases the effective electrical thickness that is necessary for a gate-all-around input/output (I/O) transistor. In one or more embodiments, after the atomic layer deposition of a low-κ material, a PME process is used to suppress bulk defects formed in the low-κ material.

One or more embodiments provide method of manufacturing a gate-all-around (GAA) input/output (I/O) transistor. The method includes forming a thermal oxide layer though an enhanced in situ steam generation (eISSG) process in combination with atomic layer deposition of a low-κ layer. The thin thermal oxide layer passivates the interface between the silicon layer and the low-κ dielectric layer of the GAA. A passivation process after the deposition of the low-κ layer reduces the bulk trap and enhances the breakdown performance of the GAA transistor.

FIG. 1 is a process flow diagram of a manufacturing process 100 for forming a GAA transistor, according to various embodiments of the disclosure. FIGS. 2A-2E are schematic cross-sectional views of the GAA structure 200 corresponding to various stages of process 100, according to embodiments of the disclosure. Although process 100 is depicted for forming a nanowire GAA structure, process 100 may be employed to form other structures on a substrate as well.

Figure 2A:
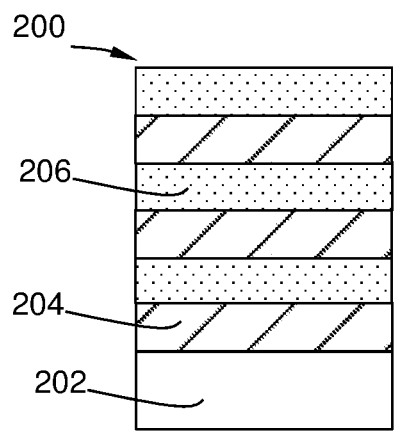
FIG. 2A is a cross-sectional view of a gate-all-around (GAA) transistor, according to one or more embodiment of the disclosure.

Process 100 begins at operation 102, in which alternating silicon layers 204 and silicon-germanium (SiGe) layers 206 are formed on a bulk semiconductor substrate 202, as illustrated in FIG. 2A. Bulk semiconductor substrate 202 may be formed of silicon, silicon germanium, or any other suitable bulk crystalline semiconductor material. Silicon layers 204 and silicon-germanium layers 206 may each be formed via a selective epitaxial growth (SEG) process, and typically include a crystalline semiconductor material.

Figure 2B:
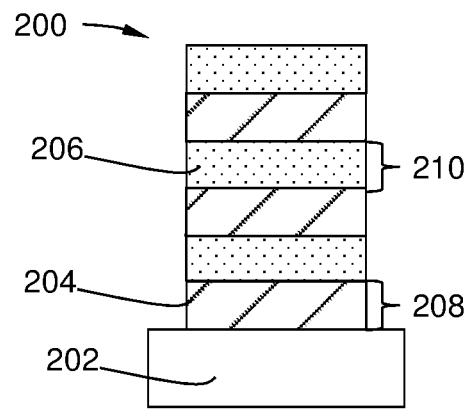
FIG. 2B is a cross-sectional view of a gate-all-around (GAA) transistor, according to one or more embodiment of the disclosure.

In operation 104, silicon layers 204 and silicon-germanium layers 206 are patterned and etched to expose vertical sidewalls 208 on silicon layers 204 and vertical sidewalls 210 on silicon-germanium layers 206, as illustrated in FIG. 2B. In some embodiments, operation 104 includes a deep reactive-ion etch (DRIE) process.

Figure 2C:
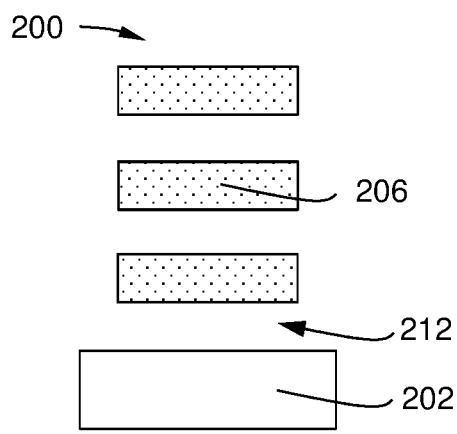
FIG. 2C is a cross-sectional view of a gate-all-around (GAA) transistor, according to one or more embodiment of the disclosure.
Figure 2D:
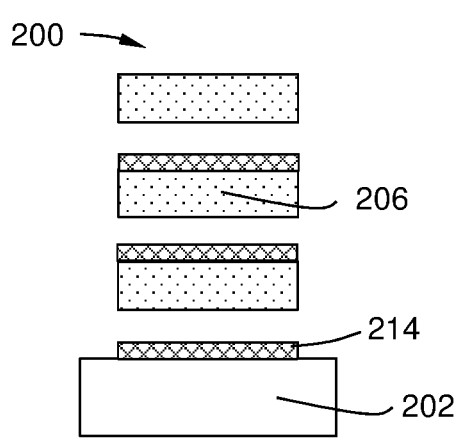
FIG. 2D is a cross-sectional view of a gate-all-around (GAA) transistor, according to one or more embodiment of the disclosure.

In operation 106, silicon-germanium layers 206 are selectively etched inward from vertical sidewalls 210, to form channels or openings 212, as illustrated in FIG. 2C. In some embodiments, a chemical vapor etching (CVE) process is used to selectively remove silicon-germanium layers 206 over silicon layers 204. For example, gaseous hydrochloric acid selective etching of SiGe versus Si in a reduced pressure-chemical vapor deposition reactor has been demonstrated. Alternatively, an ex-situ HF-dip followed by a GeH$_4$-enhanced Si etch that is performed in-situ in an epi reactor can be employed in operation 106.

In operation 108, a thermal oxide layer 214 is formed on the silicon layer 204. In one or more embodiments, the thermal oxide layer comprises one of more of silicon oxide. In one or more embodiments, the thermal oxide layer is formed by an enhanced in-situ steam generation (eISSG) process.

Typically, an oxide layer can be formed using a wet furnace oxidation process or a dry oxidation process. The wet furnace oxidation process exposes the silicon layer to a high temperature environment in the presence of water vapor. Water from the water vapor diffuses through the oxide layer to an oxide/silicon interface, wherein the water interacts with silicon to form silicon dioxide. Wet furnace oxidation processes, however, can cause the oxide layer to bulge outward from the silicon layer, providing a surface having a convex curvature that forms non-uniformities. The non-uniformities result in performance and reliability issues. Furthermore, wet furnace oxidation processes also provide a poor quality oxide due to dangling bonds in non-reactive silicon. The poor quality oxide increases roughness at an interface between the oxide layer and the silicon layer.

Accordingly, in one or more embodiments an enhanced in situ steam generation (eISSG) process is used to form a thermal oxide layer 214 on the silicon layer 204. As used herein, the term "in situ steam generation (ISSG) process" refers to an oxidation technology for single-wafer rapid thermal processing (RTP). ISSG is a low-pressure process (typically below about 20 Torr) wherein pre-mixed hydrogen ($H_2$) and oxygen ($O_2$) are introduced to the process chamber directly, without pre-combustion. Process gases (pure hydrogen ($H_2$) and oxygen ($O_2$)) are mixed in a plenum and are then injected into the chamber, where they flow across a rotating substrate heated by lamps, e.g. tungsten-halogen, separated by a thin quartz window. The reaction between hydrogen ($H_2$) and oxygen ($O_2$) occurs close to the substrate surface because the hot substrate acts as the ignition source. In one or more embodiments, the thermal oxide layer 214 has a thickness in a range of about 3 to about 10 Å, including about 3 Å, about 4 Å, about 5 Å, about 6 Å, about 7 Å, about 8 Å, about 9 Å, or about 10 Å.

Figure 2E:
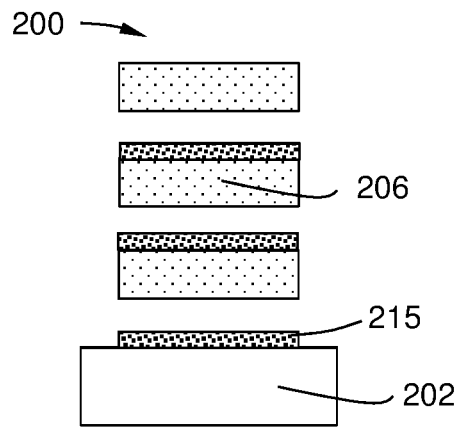
FIG. 2E is a cross-sectional view of a gate-all-around (GAA) transistor, according to one or more embodiment of the disclosure.

In operation 110, the thermal oxide layer 214 is passivated and functionalized by one or more of an annealing process, e.g. RTX (with $RTH_2$ or $RTN_2$), or a plasma treatment process, e.g. DPX (with DPHe, $DPH_2$, $DPN_2$, or $DPNH_3$), and the like, as illustrated in FIG. 2E to form a passivated and functionalized thermal oxide layer 215.

Figure 2F:
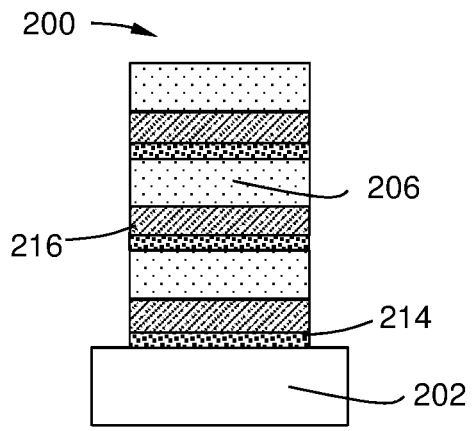
FIG. 2F is a cross-sectional view of a gate-all-around (GAA) transistor, according to one or more embodiment of the disclosure.
Figure 2G:
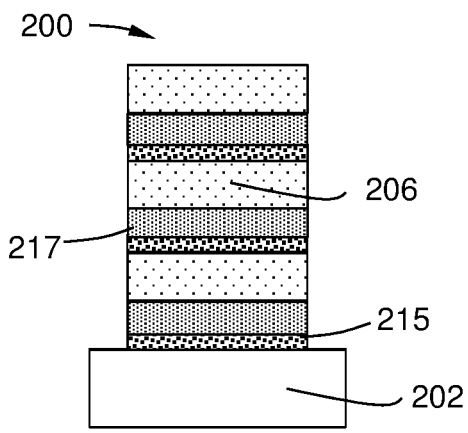
FIG. 2G is a cross-sectional view of a gate-all-around (GAA) transistor, according to one or more embodiment of the disclosure.

In operation 112, a low-κ layer 216 is then conformally deposited on the passivated and functionalized thermal oxide layer 215, as illustrated in FIG. 2F. In one or more embodiments, the low-κ layer 216 fills at least a portion of the channel 212. In one or more embodiments, the low-κ is deposited by atomic layer deposition (ALD). In one or more embodiments, the low-k is deposited by plasma enhanced atomic layer deposition (PEALD). In one or more embodiments, the low-κ layer 216 has a thickness of less than about 2 nm, or less than about 1.5 nm.

In one or more embodiments, the low-κ layer 216 has a dielectric constant or extinction coefficient or κ-value in a range of about 2.0 to about 6.0, including about 2.25, about 2.5, about 2.75, about 3.0, about 3.25, about 3.5, about 3.75, about 4.0, about 4.25, about 4.5, about 4.75, about 5.0, about 5.25, about 5.5, about 5.75, or about 6.0. In one or more specific embodiments, the low-κ layer 216 has a dielectric constant or extinction coefficient or κ-value of about 2.

In one or more embodiments, the low-κ layer 216 comprises any low-κ dielectric material known to one of skill in the art. In one or more embodiments, the low-κ layer 216 comprises a low-κ dielectric material with atoms of one or more of silicon (Si), aluminum (Al), carbon (C), oxygen (O), hydrogen (H), or nitrogen (N). For example, the low-κ layer 216 comprises one or more of silicon oxide, silicon oxycarbide, silicon oxynitride, SiCOH, SiCONH, aluminum oxide, and the like. While the term "silicon oxide" may be used to describe the low-κ layer 216, the skilled artisan will recognize that the disclosure is not restricted to a particular stoichiometry. For example, the terms "silicon oxide" and "silicon dioxide" may both be used to describe a material having silicon and oxygen atoms in any suitable stoichiometric ratio. The same is true for the other materials listed in this disclosure, e.g. silicon nitride, silicon oxynitride, aluminum oxide, zirconium oxide, and the like.

"Atomic layer deposition" or "cyclical deposition" as used herein refers to the sequential exposure of two or more reactive compounds to deposit a layer of material on a substrate surface. The substrate, or portion of the substrate, is exposed sequentially or separately to the two or more reactive compounds which are introduced into a reaction zone of a processing chamber. In a time-domain ALD process, exposure to each reactive compound is separated by a time delay to allow each compound to adhere and/or react on the substrate surface and then be purged from the processing chamber. These reactive compounds are said to be exposed to the substrate sequentially.

In a spatial ALD process, different portions of the substrate surface, or material on the substrate surface, are exposed simultaneously to the two or more reactive compounds so that any given point on the substrate is substantially not exposed to more than one reactive compound simultaneously. As used in this specification and the appended claims, the term "substantially" used in this respect means, as will be understood by those skilled in the art, that there is the possibility that a small portion of the substrate may be exposed to multiple reactive gases simultaneously due to diffusion, and that the simultaneous exposure is unintended.

In one aspect of a time-domain ALD process, a first reactive gas (i.e., a first precursor or compound A, e.g. manganese precursor, ruthenium precursor, or a manganese-ruthenium precursor) is pulsed into the reaction zone followed by a first time delay. Next, a second precursor or compound B (e.g. reductant) is pulsed into the reaction zone followed by a second delay. During each time delay, a purge gas, such as argon, may be introduced into the processing chamber to purge the reaction zone or otherwise remove any residual reactive compound or reaction by-products from the reaction zone. Alternatively, the purge gas may flow continuously throughout the deposition process so that only the purge gas flows during the time delay between pulses of reactive compounds. The reactive compounds are alternatively pulsed until a desired film or film thickness is formed on the substrate surface. In either scenario, the ALD process of pulsing compound A, purge gas, compound B, and purge gas is a cycle. A cycle can start with either compound A or compound B and continue the respective order of the cycle until achieving a film with the predetermined thickness.

A "pulse" or "dose" as used herein is intended to refer to a quantity of a source gas that is intermittently or non-continuously introduced into the process chamber. The quantity of a particular compound within each pulse may vary over time, depending on the duration of the pulse. A particular process gas may include a single compound or a mixture/combination of two or more compounds, for example, the process gases described below.

The durations for each pulse/dose are variable and may be adjusted to accommodate, for example, the volume capacity of the processing chamber as well as the capabilities of a vacuum system coupled thereto. Additionally, the dose time of a process gas may vary according to the flow rate of the process gas, the temperature of the process gas, the type of control valve, the type of process chamber employed, as well as the ability of the components of the process gas to adsorb onto the substrate surface. Dose times may also vary based upon the type of layer being formed and the geometry of the device being formed. A dose time should be long enough to provide a volume of compound sufficient to adsorb/chemisorb onto substantially the entire surface of the substrate and form a layer of a process gas component thereon.

The metal precursor-containing process gas may be provided in one or more pulses or continuously. The flow rate of the metal precursor-containing process gas can be any suitable flow rate including, but not limited to, flow rates is in the range of about 1 to about 5000 sccm, or in the range of about 2 to about 4000 sccm, or in the range of about 3 to about 3000 sccm or in the range of about 5 to about 2000 sccm. The metal precursor can be provided at any suitable pressure including, but not limited to, a pressure in the range of about 5 mTorr to about 500 Torr, or in the range of about 100 mTorr to about 500 Torr, or in the range of about 5 Torr to about 500 Torr, or in the range of about 50 mTorr to about 500 Torr, or in the range of about 100 mTorr to about 500 Torr, or in the range of about 200 mTorr to about 500 Torr.

The period of time that the substrate is exposed to the one or more metal precursor-containing process gas may be any suitable amount of time necessary to allow the metal precursor to form an adequate nucleation layer atop the conductive surface of the bottom of the opening. For example, the process gas may be flowed into the process chamber for a period of about 0.1 seconds to about 90 seconds. In some time-domain ALD processes, the metal precursor-containing process gas is exposed the substrate surface for a time in the range of about 0.1 sec to about 90 sec, or in the range of about 0.5 sec to about 60 sec, or in the range of about 1 sec to about 30 sec, or in the range of about 2 sec to about 25 sec, or in the range of about 3 sec to about 20 sec, or in the range of about 4 sec to about 15 sec, or in the range of about 5 sec to about 10 sec.

In some embodiments, an inert carrier gas may additionally be provided to the process chamber at the same time as the metal precursor-containing process gas. The carrier gas may be mixed with the metal precursor-containing process gas (e.g., as a diluent gas) or separately and can be pulsed or of a constant flow. In some embodiments, the carrier gas is flowed into the processing chamber at a constant flow in the range of about 1 to about 10000 sccm. The carrier gas may be any inert gas, for example, such as argon, helium, neon, combinations thereof, or the like. In one or more embodiments, a metal precursor-containing process gas is mixed with argon prior to flowing into the process chamber.

In an embodiment of a spatial ALD process, a first reactive gas and second reactive gas (e.g., nitrogen gas) are delivered simultaneously to the reaction zone but are separated by an inert gas curtain and/or a vacuum curtain. The substrate is moved relative to the gas delivery apparatus so that any given point on the substrate is exposed to the first reactive gas and the second reactive gas.

In operation 114, low-κ layer 216 is densified and passivated to reduce the bulk trap. In one or more embodiments, the low-κ layer 216 is treated with one or more of an annealing process, e.g. RTX (with $RTH_2$ or $RTN_2$), or a plasma treatment process, e.g. DPX (with DPHe, $DPH_2$, $DPN_2$, or $DPNH_3$) to form a densified/passivated low-κ layer 217.

In one or more embodiments, the density of the post-ALD densified/passivated low-κ layer 217 is in a range of greater than about 2.1 g/cc, including greater than about 2.15 g/cc, greater than about 2.2 g/cc, greater than about 2.25 g/cc, greater than about 2.3 g/cc, greater than about 2.35 g/cc, greater than about 2.4 g/cc, or greater than about 2.5 g/cc.

Referring to FIG. 1, in one or more embodiments, operation 108, operation 110, operation 112, and operation 114 are integrated by using advanced process controls (APC). As used herein, the term "integrated" means that formation of the thermal oxide, the passivation and functionalization, the ALD deposition of the low-κ layer 216, and the densification and passivation of the low-κ layer 216 are performed in the same platform (under vacuum processing). At operation 120, integrated metrology may be used to determine the thickness of the thermal oxide layer 214 and the low-κ layer 216. In some embodiments, the integrated metrology is conducted in situ. Once the thickness of the layers 214, 216 has been determined by integrated metrology, the measurements will be fed to the tool so compensation can be performed (e.g. thickness/composition of first layer can be adjusted accordingly). In some embodiments, advanced process controls comprise one or more of scatterometry (i.e., optical critical dimension (OCD) metrology), refractometry, ellipsometry or e-beam.

After operation 114, remaining components of GAA transistor 200 may be completed using conventional fabrication techniques known to those skilled in the art.

Figure 3:
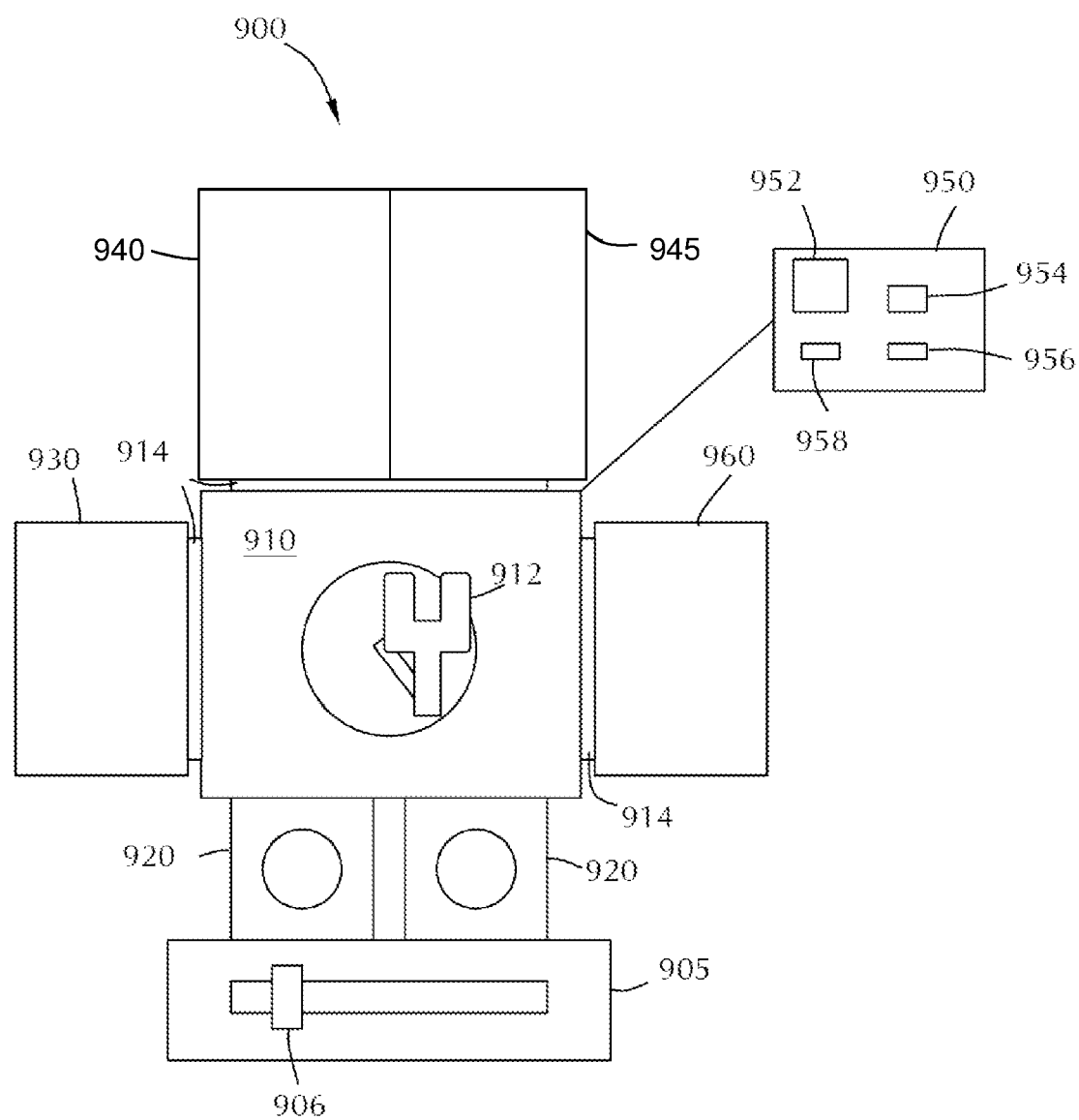
FIG. 3 shows a schematic view of a processing system to perform the methods of any of the embodiments of the disclosure.

With reference to FIG. 3, additional embodiments of the disclosure are directed to a processing system 900 for executing the methods described herein. FIG. 3 illustrates a system 900 that can be used to process a substrate according to one or more embodiment of the disclosure. The system 900 can be referred to as a cluster tool. The system 900 includes a central transfer station 910 with a robot 912 therein. The robot 912 is illustrated as a single blade robot; however, those skilled in the art will recognize that other robot 912 configurations are within the scope of the disclosure. The robot 912 is configured to move one or more substrate between chambers connected to the central transfer station 910.

At least one pre-clean/buffer chamber 920 is connected to the central transfer station 910. The pre-clean/buffer chamber 920 can include one or more of a heater, a radical source or plasma source. The pre-clean/buffer chamber 920 can be used as a holding area for an individual semiconductor substrate or for a cassette of wafers for processing. The pre-clean/buffer chamber 920 can perform pre-cleaning processes or can pre-heat the substrate for processing or can simply be a staging area for the process sequence. In some embodiments, there are two pre-clean/buffer chambers 920 connected to the central transfer station 910.

In the embodiment shown in FIG. 3, the pre-clean chambers 920 can act as pass through chambers between the factory interface 905 and the central transfer station 910. The factory interface 905 can include one or more robot 906 to move substrate from a cassette to the pre-clean/buffer chamber 920. The robot 912 can then move the substrate from the pre-clean/buffer chamber 920 to other chambers within the system 900.

A first processing chamber 930 can be connected to the central transfer station 910. The first processing chamber 930 can be configured as ISSG chamber and may be in fluid communication with one or more reactive gas sources to provide one or more flows of reactive gases to the first processing chamber 930. The substrate can be moved to and from the processing chamber 930 by the robot 912 passing through isolation valve 914.

Processing chamber 940 can also be connected to the central transfer station 910. In some embodiments, processing chamber 940 comprises an ALD deposition chamber and is fluid communication with one or more reactive gas sources to provide flows of reactive gas to the processing chamber 940 to perform the isotropic etch process. The substrate can be moved to and from the processing chamber 940 by robot 912 passing through isolation valve 914.

Processing chamber 945 can also be connected to the central transfer station 910. In some embodiments, the processing chamber 945 is the same type of processing chamber 940 configured to perform the same process as processing chamber 940. This arrangement might be useful where the process occurring in processing chamber 940 takes much longer than the process in processing chamber 930.

In some embodiments, processing chamber 960 is connected to the central transfer station 910 and is configured to act as densification and/or passivation chamber. The processing chamber 960 can be configured to perform one or more different epitaxial growth processes.

In some embodiments, each of the processing chambers 930, 940, 945 and 960 are configured to perform different portions of the processing method. For example, processing chamber 930 may be configured to perform eISSG process, processing chamber 940 may be configured to perform ALD deposition, processing chamber 945 may be configured as a metrology station or to perform densification or passivation process and processing chamber 960 may be configured to perform a second passivation process. The skilled artisan will recognize that the number and arrangement of individual processing chambers on the tool can be varied and that the embodiment illustrated in FIG. 3 is merely representative of one possible configuration.

In some embodiments, the processing system 900 includes one or more metrology stations. For example metrology stations can be located within pre-clean/buffer chamber 920, within the central transfer station 910 or within any of the individual processing chambers. The metrology station can be any position within the system 900 that allows the thickness of the thermal oxide layer and/or the low-κ layer to be measured without exposing the substrate to an oxidizing environment.

At least one controller 950 is coupled to one or more of the central transfer station 910, the pre-clean/buffer chamber 920, and processing chambers 930, 940, 945, or 960. In some embodiments, there are more than one controller 950 connected to the individual chambers or stations and a primary control processor is coupled to each of the separate processors to control the system 900. The controller 950 may be one of any form of general-purpose computer processor, microcontroller, microprocessor, etc., that can be used in an industrial setting for controlling various chambers and sub-processors.

The at least one controller 950 can have a processor 952, a memory 954 coupled to the processor 952, input/output devices 956 coupled to the processor 952, and support circuits 958 to communication between the different electronic components. The memory 954 can include one or more of transitory memory (e.g., random access memory) and non-transitory memory (e.g., storage).

The memory 954, or computer-readable medium, of the processor may be one or more of readily available memory such as random access memory (RAM), read-only memory (ROM), floppy disk, hard disk, or any other form of digital storage, local or remote. The memory 954 can retain an instruction set that is operable by the processor 952 to control parameters and components of the system 900. The support circuits 958 are coupled to the processor 952 for supporting the processor in a conventional manner. Circuits may include, for example, cache, power supplies, clock circuits, input/output circuitry, subsystems, and the like.

Processes may generally be stored in the memory as a software routine that, when executed by the processor, causes the process chamber to perform processes of the present disclosure. The software routine may also be stored and/or executed by a second processor (not shown) that is remotely located from the hardware being controlled by the processor. Some or all of the method of the present disclosure may also be performed in hardware. As such, the process may be implemented in software and executed using a computer system, in hardware as, e.g., an application specific integrated circuit or other type of hardware implementation, or as a combination of software and hardware. The software routine, when executed by the processor, transforms the general purpose computer into a specific purpose computer (controller) that controls the chamber operation such that the processes are performed.

In some embodiments, the controller 950 has one or more configurations to execute individual processes or sub-processes to perform the method. The controller 950 can be connected to and configured to operate intermediate components to perform the functions of the methods. For example, the controller 950 can be connected to and configured to control one or more of gas valves, actuators, motors, slit valves, vacuum control, etc.

The controller 950 of some embodiments has one or more configurations selected from: a configuration to move a substrate on the robot between the plurality of processing chambers and metrology station; a configuration to load and/or unload substrates from the system; a configuration to form a thermal oxide layer by an enhanced in situ steam generation (eISSG) process; a configuration to functionalize and/or passivate a thermal oxide layer; a configuration to perform an atomic layer deposition (ALD); or a configuration to densify and/or passivate a low-κ layer.

One or more embodiments are directed to a non-transitory computer readable medium including instructions, that, when executed by a controller of a processing chamber, cause the processing chamber to perform the operations of forming alternating layers of silicon and silicon germanium on a substrate; patterning and etching the alternating layers of silicon and silicon germanium to expose at least one sidewall; selective etching the silicon germanium layers; performing an enhanced in situ steam generation process to form a thermal oxide layer on the silicon layer; passivating the thermal oxide layer; depositing a low-κ layer; and densifying and/or passivating the low-κ layer.

Reference throughout this specification to "one embodiment," "certain embodiments," "one or more embodiments" or "an embodiment" means that a particular feature, structure, material, or characteristic described in connection with the embodiment is included in at least one embodiment of the disclosure. Thus, the appearances of the phrases such as "in one or more embodiments," "in certain embodiments," "in one embodiment" or "in an embodiment" in various places throughout this specification are not necessarily referring to the same embodiment of the disclosure. Furthermore, the particular features, structures, materials, or characteristics may be combined in any suitable manner in one or more embodiments.

Although the disclosure herein has been described with reference to particular embodiments, those skilled in the art will understand that the embodiments described are merely illustrative of the principles and applications of the present disclosure. It will be apparent to those skilled in the art that various modifications and variations can be made to the method and apparatus of the present disclosure without departing from the spirit and scope of the disclosure. Thus, the present disclosure can include modifications and variations that are within the scope of the appended claims and their equivalents.

What is claimed is:

1. A method of manufacturing an electronic device, the method comprising:
   forming alternating layers of silicon (Si) and silicon germanium (SiGe) on a substrate;
   patterning and etching the alternating layers of silicon and silicon germanium to expose at least one side wall of the silicon layer and at least one sidewall of the silicon germanium layer;
   selectively etching the silicon germanium layer to form an opening;
   forming a thermal oxide layer on the silicon layer through the opening;
   passivating the thermal oxide layer to form a passivated thermal oxide layer;
   depositing a low-κ layer on the passivated thermal oxide layer through the opening; and
   densifying the low-κ layer to form a densified low-κ layer.

2. The method of claim 1, wherein the alternating layers of silicon and silicon germanium are formed by a selective epitaxial growth (SEG) process.

3. The method of claim 1, wherein forming the thermal oxide layer comprises an enhanced in situ steam generation (eISSG) process.

4. The method of claim 1, wherein the thermal oxide layer has a thickness in a range of about 3 to about 10 Å.

5. The method of claim 1, wherein the low-κ layer has a thickness less than about 2 nm.

6. The method of claim 5, wherein the low-κ layer has a thickness less than about 1.5 nm.

7. The method of claim 1, wherein in the thermal oxide layer comprises silicon oxide.

8. The method of claim 1, wherein the low-κ layer comprises one or more of silicon oxide, silicon oxycarbide, silicon oxynitride, SiCOH, SiCONH, or aluminum oxide.

9. The method of claim 1, wherein the low-κ layer has a dielectric constant in a range of about 1 to about 6.

10. The method of claim 1, wherein depositing the low-κ layer on the passivated thermal oxide layer comprises an atomic layer deposition process.

11. The method of claim 10, wherein the atomic layer deposition process is a plasma enhanced atomic layer deposition process.

12. The method of claim 1, wherein passivating the thermal oxide layer comprises one or more of an annealing process or a plasma treatment process.

13. The method of claim 12, wherein passivating the thermal oxide layer comprises annealing the thermal oxide layer with one or more of $RTH_2$ or $RTN_2$.

14. The method of claim 12, wherein passivating the thermal oxide layer comprises a plasma treatment process with one or more of DPHe, $DPH_2$, $DPN_2$, or $DPNH_3$.

15. The method of claim 1, wherein densifying the low-κ layer comprises annealing the low-κ layer with one or more of $RTH_2$ or $RTN_2$.

16. The method of claim 1, wherein densifying the low-κ layer comprises a plasma treatment process with one or more of DPHe, $DPH_2$, $DPN_2$, or $DPNH_3$.

17. The method of claim 1, wherein the electronic device is a gate-all-around (GAA) transistor.

18. The method of claim 17, wherein the gate-all-around transistor comprises a source region having a source and a source contact, the source region on a top surface of the substrate; a drain region having a drain and a drain contact, the drain region on the top surface of the substrate; a channel located between the source and the drain and having an axis that that is substantially orthogonal to the top surface of the substrate; a gate enclosing the channel between the source region and the drain region; the thermal oxide layer overlying and in contact with one or more of the gate, the source contact, or the drain contact; and the low-κ layer overlying the thermal oxide layer.

19. A non-transitory computer readable medium including instructions, that, when executed by a controller of a processing chamber, causes the processing chamber to perform operations of:
  forming alternating layers of silicon and silicon germanium on a substrate;
  patterning and etching the alternating layers of silicon and silicon germanium to expose at least one sidewall;
  selectively etching the silicon germanium layers;
  performing an enhanced in situ steam generation process to form a thermal oxide layer on the silicon layer;
  passivating the thermal oxide layer;
  depositing a low-κ layer; and
  densifying and/or passivating the low-κ layer.

* * * * *